(12) United States Patent
Chew

(10) Patent No.: US 12,080,565 B2
(45) Date of Patent: Sep. 3, 2024

(54) CHIP PACKAGING METHOD AND PACKAGE STRUCTURE

(71) Applicant: PEP INNOVATION PTE. LTD., Singapore (SG)

(72) Inventor: Jimmy Chew, Singapore (SG)

(73) Assignee: PEP INNOVATION PTE. LTD., Singapore (SG)

( * ) Notice: Subject to any disclaimer, the term of this patent is extended or adjusted under 35 U.S.C. 154(b) by 450 days.

(21) Appl. No.: 17/467,277

(22) Filed: Sep. 6, 2021

(65) Prior Publication Data

US 2021/0398822 A1    Dec. 23, 2021

Related U.S. Application Data

(62) Division of application No. 16/805,846, filed on Mar. 2, 2020, now Pat. No. 11,114,315.

(30) Foreign Application Priority Data

Mar. 4, 2019   (SG) ............................ 10201901893Q
Mar. 11, 2019  (SG) ............................ 10201902149Q (Continued)

(51) Int. Cl.
*H01L 21/56* (2006.01)
*H01L 23/00* (2006.01)
(Continued)

(52) U.S. Cl.
CPC .......... *H01L 21/568* (2013.01); *H01L 23/295* (2013.01); *H01L 23/3135* (2013.01);
(Continued)

(58) Field of Classification Search
CPC . H01L 21/568; H01L 23/295; H01L 23/3135; H01L 24/03; H01L 24/05;
(Continued)

(56) References Cited

U.S. PATENT DOCUMENTS

2006/0043364 A1* 3/2006 Jiang ...................... H01L 24/03
257/E29.022
2010/0171205 A1* 7/2010 Chen ..................... H01L 21/565
257/692

(Continued)

*Primary Examiner* — Thanhha S Pham
(74) *Attorney, Agent, or Firm* — Javalon Law, PC

(57) ABSTRACT

The present disclosure provides a chip packaging method and a package structure. The chip packaging method comprises: forming a protective layer having material properties on a die active surface of a die; attaching (such as adhering) the die in which the die active surface is formed with the protective layer onto a carrier, the die active surface facing the carrier, and a die back surface of the die facing away from the carrier; forming an encapsulation layer having material properties to encapsulate the die; removing (such as stripping off) the carrier to expose the protective layer; and forming a conductive layer and a dielectric layer. The chip packaging method reduces or eliminates warpage in the panel packaging process, lowers a requirement on an accuracy of aligning the die on the panel, reduces a difficulty in the panel packaging process, and makes the packaged chip structure more durable, and thus the present disclosure is especially suitable for large panel-level package and package of a thin chip with a large electric flux.

14 Claims, 8 Drawing Sheets

(30) Foreign Application Priority Data

Mar. 19, 2019 (SG) .......................... 10201902426V
Jul. 19, 2019 (CN) .......................... 201910656802.0

(51) Int. Cl.
*H01L 23/29* (2006.01)
*H01L 23/31* (2006.01)

(52) U.S. Cl.
CPC .............. *H01L 24/03* (2013.01); *H01L 24/05* (2013.01); *H01L 24/13* (2013.01); *H01L 24/24* (2013.01); *H01L 2224/02379* (2013.01); *H01L 2224/02381* (2013.01); *H01L 2224/03825* (2013.01); *H01L 2224/13024* (2013.01); *H01L 2224/24101* (2013.01); *H01L 2224/24137* (2013.01)

(58) Field of Classification Search
CPC ...................... H01L 24/13; H01L 24/24; H01L 2224/02379; H01L 2224/02381; H01L 2224/03825; H01L 2224/13024; H01L 2224/24101; H01L 2224/24137; H01L 24/73; H01L 2221/68345; H01L 2224/32225; H01L 2224/73267; H01L 23/3121; H01L 23/562; H01L 24/32; H01L 24/96; H01L 2224/214; H01L 2224/32245; H01L 21/6835; H01L 21/78; H01L 23/3157; H01L 24/19; H01L 24/20; H01L 21/56; H01L 23/3128; H01L 21/561; H01L 24/02; H01L 2224/0231; H01L 2224/0237; H01L 2224/0345; H01L 2224/03452; H01L 2224/03462; H01L 2224/03464; H01L 2224/04105; H01L 2224/05008; H01L 2224/05088; H01L 2224/05111; H01L 2224/05124; H01L 2224/05139; H01L 2224/05144; H01L 2224/05147; H01L 2224/05569; H01L 2224/05611; H01L 2224/05624; H01L 2224/05639; H01L 2224/05644; H01L 2224/05647; H01L 2224/12105; H01L 2224/131; H01L 2224/16227; H01L 2224/95; H01L 2224/96; H01L 2924/18161; H01L 2924/18162
See application file for complete search history.

(56) References Cited

U.S. PATENT DOCUMENTS

2011/0198762 A1* 8/2011 Scanlan .................. H01L 24/20
257/793
2015/0155248 A1* 6/2015 Lin .......................... H01L 21/56
257/737

* cited by examiner

CHIP PACKAGING METHOD AND PACKAGE STRUCTURE

CROSS-REFERENCE TO RELATED APPLICATIONS

This application is a divisional application of co-pending U.S. patent application Ser. No. 16/805,846 entitled "Chip Packaging Method and Package Structure", filed on Mar. 2, 2020, which is a continuation-in-part application of U.S. Pat. No. 11,049,734 entitled "Method of Packaging Chip and Chip Package Structure", filed on Nov. 29, 2017. The both applications also cross-reference to co-pending U.S. patent application Ser. No. 16/805,850 entitled "Chip Packaging Method and Package Structure", filed on Mar. 2, 2020, co-pending U.S. patent application Ser. No. 16,805,851 entitled "Chip Packaging Method and Package Structure", filed on Mar. 2, 2020, and co-pending U.S. patent application Ser. No. 16/805,853 entitled "Chip Packaging Method and Chip Structure", filed on Mar. 2, 2020. All disclosures are herein incorporated by reference in their entireties for all purposes.

TECHNICAL FIELD

The present disclosure relates to a field of semiconductor technologies, and more particularly, to a chip packaging method and a package structure.

BACKGROUND

Panel-level package is a process of cutting a wafer to separate out a plurality of dies, arranging and adhering the dies onto a carrier, and simultaneously packaging the plurality of dies in a same process. The panel-level package has received wide attention as a technique emerging in recent years; and as compared with traditional wafer-level package, the panel-level package has advantages of high production efficiency, low production costs, and better applicability to mass production.

However, numerous technical barriers exist in the panel-level package, for example, a warpage problem of the panel, an accuracy of alignment of the die on the panel, and so on.

Especially under a current trend that electronic devices become smaller and lighter, small and thin chips are increasingly favored by the market; however, difficulties in packaging the small and thin chips by using a large panel packaging technique should not be underestimated.

SUMMARY

According to various embodiments, there is provided a chip packaging method, including: forming a protective layer on a die active surface of a die; attaching the die with the protective layer onto a carrier, wherein the die active surface faces to the carrier and a die back surface of the die faces away from the carrier; forming an encapsulation layer for encapsulating the die; and removing the carrier for exposing the protective layer.

According to various embodiments, there is provided a chip packaging method for processing a wafer, wherein the wafer includes a protective layer on a wafer active surface, the chip packaging method including: singulating the wafer into a plurality of dies having the protective layer on die active surfaces of the dies; attaching the dies onto a carrier wherein the die active surfaces face to the carrier and die back surfaces of the die face away from the carrier; forming an encapsulation layer for encapsulating the dies; and removing the carrier for exposing the protective layer.

According to various embodiments, there is provided a method for chip packaging of a plurality of dies, including: providing a protective layer including an organic/inorganic composite material layer with filler particles for the protective layer, wherein the protective layer includes Young's Modules and a protective layer thickness for providing buffering and support for a conductive layer and for preventing burring and chipping from a singulation process to separate a wafer into the dies, and wherein the protective layer includes a coefficient of thermal expansion for preventing interface stress and interface fatigue between the dies and the protective layer; forming the protective layer on a die active surface of a die; and forming a plurality of protective layer openings in the protective layer.

BRIEF DESCRIPTION OF THE DRAWINGS

FIG. 1 to FIG. 12 are schematic diagrams of a chip packaging method according to an exemplary embodiment of the present disclosure, in which:

FIG. 1 is a schematic diagram of a semiconductor wafer according to the exemplary embodiment of the present disclosure;

FIG. 2 is a schematic diagram of the semiconductor wafer applied with a protective layer according to the exemplary embodiment of the present disclosure;

FIG. 4 is a schematic diagram of cutting the semiconductor wafer to obtain a die having the protective layer according to the exemplary embodiment of the present disclosure;

FIG. 6 is a schematic diagram of forming an encapsulation layer on the carrier according to the exemplary embodiment of the present disclosure;

FIG. 8 is a schematic diagram of stripping off the carrier and an adhesive layer according to the exemplary embodiment of the present disclosure;

FIG. 9 is a schematic diagram of forming the conductive filled vias and traces on a panel assembly according to the exemplary embodiment of the present disclosure;

FIG. 10 is a schematic diagram of forming studs on the panel assembly according to the exemplary embodiment of the present disclosure;

FIG. 12 is a schematic diagram of cutting the panel assembly to obtain a packaged chip according to the exemplary embodiment of the present disclosure;

DETAILED DESCRIPTION

In order to make the technical solution of the present disclosure clearer and the technical effect more apparent, preferred embodiments of the present disclosure will be described and explained in detail below in conjunction with the accompanying drawings; it cannot be understood that the description below is the only implementation form of the present disclosure or a limitation to the present disclosure.

FIG. 1 to FIG. 12 are schematic diagrams of a chip packaging method according to an exemplary embodiment of the present disclosure.

Figure 1:
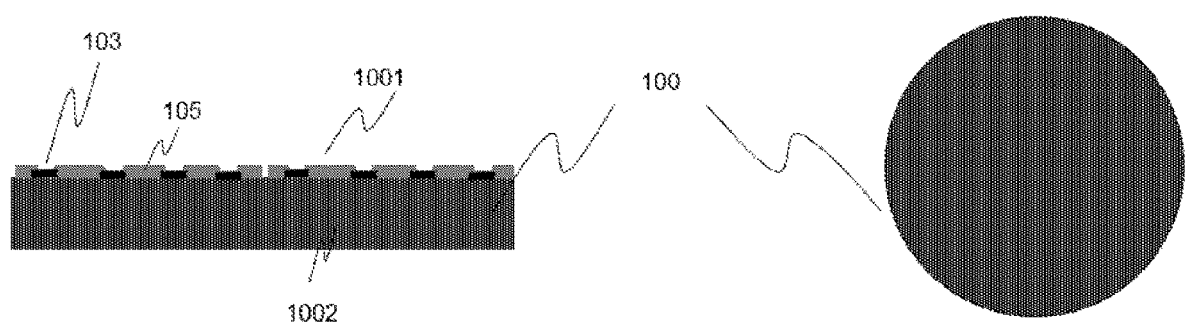

As shown in FIG. 1, at least one wafer 100 is provided; the wafer 100 has a wafer active surface 1001 and a wafer back surface 1002; the wafer 100 includes a plurality of dies 113, and active surfaces of the dies constitutes the wafer active surface 1001; the active surface of each die in the wafer 100 forms active components and passive components by using a series of processes such as doping, deposition and etching, etc.; the active components include diodes and triodes, etc.; the passive components include voltage elements, capacitors, resistors and inductors, etc.; and these active components and passive components are connected by connection wires to form a functional circuit, so as to implement various functions. The wafer active surface 1001 further includes die pads 103 for leading out the functional circuit and an insulating layer 105 for protecting the die pads 103.

Preferably, a chemical plating process is performed on the wafer active surface 1001 to form a conductive cover layer on the die pads 103. Optionally, the conductive cover layer comprises one or more layers of Cu, Ni, Pd, Au, Cr; preferably, the conductive protective layer is a Cu layer; and the conductive cover layer preferably has a thickness of 2 μm to 3 μm. The conductive cover layer is not shown in FIG. 1. The conductive cover layer protects the die pads 103 provided on the wafer active surface 1001 from being damaged by laser in a subsequent step of forming a protective layer opening.

Figure 2:
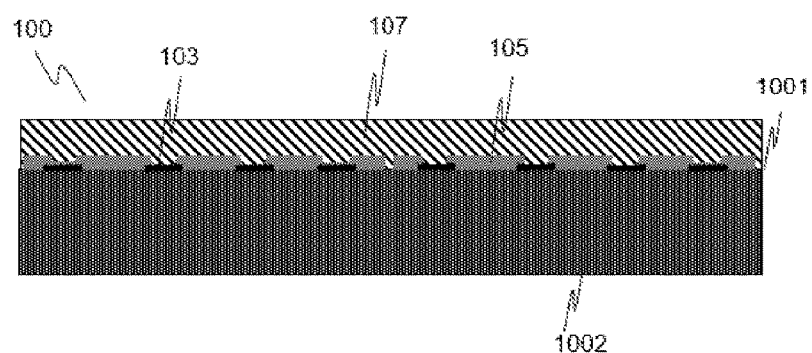

As shown in FIG. 2, a protective layer 107 is applied on the wafer active surface 1001.

In one embodiment, the protective layer 107 is applied to the wafer active surface 1001 by lamination.

Optionally, before the step of applying the protective layer 107 to the wafer active surface 1001, the wafer active surface 1001 and/or a surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase a bonding area and/or chemically-promoting modifier treatment of introducing a chemically-promoting modifier group (for example, a surface modifier comprising both a group having affinity with an organic substance and a group having affinity with an inorganic substance) between the wafer 100 and the protective layer 107 so as to increase a bonding force at an interface between the organic layer and the inorganic layer.

The protective layer 107 protects a die active surface 1131 of the die 113. In a subsequent molding process, a package pressure is liable to cause a flowing molding material to permeate into a gap between the die 113 and a carrier 117 under a heating condition, so as to damage the circuit on the die active surface 1131. By providing the protective layer on the die active surface 1131, the protective layer 107 protects the die active surface 1131 by preventing permeation of the molding material, so as to protect the die active surface 1131 from being damaged.

A bonding effect between the die 113 and an adhesive layer 121 is strengthened due to the presence of the protective layer 107, so that during the molding process, the package pressure is not easy to cause position shift of the die 113 on the carrier 117.

In a preferred embodiment, the protective layer 107 has a Young's modulus in a range of 1,000 MPa to 20,000 MPa; more preferably, the protective layer 107 has a Young's modulus in a range of 1,000 MPa to 10,000 MPa; further preferably, the protective layer 107 has a Young's modulus in a range of 1,000 MPa to 7,000 MPa, 4,000 MPa to 7,000 MPa, or 4,000 MPa to 8,000 MPa; and in a most preferred embodiment, the protective layer 107 has a Young's modulus of 5,500 MPa.

In a preferred embodiment, the protective layer 107 has a thickness in a range of 15 μm to 50 μm; more preferably, the protective layer 107 has a thickness in a range of 20 μm to 50 μm; in a preferred embodiment, the protective layer 107 has a thickness of 35 μm; in another preferred embodiment, the protective layer 107 has a thickness of 45 μm; and in still another preferred embodiment, the protective layer 107 has a thickness of 50 μm.

The protective layer 107 has the Young's modulus in the range of 1,000 MPa to 20,000 MPa; on one hand, the protective layer 107 is soft and has good flexibility and elasticity; on the other hand, the protective layer provides sufficient supporting force so that the protective layer 107 provides sufficient support for a conductive layer formed on the surface of the protective layer 107. Meanwhile, the protective layer 107 has the thickness in the range of 15 μm to 50 μm, it is ensured that the protective layer 107 provides sufficient buffering and support.

Particularly, in some types of chips, it is required not only that a thin die is packaged, but also that the conductive layer has a certain thickness suitable for a large electric flux; at this time, it is selected that the protective layer 107 has the thickness in the range of 15 μm to 50 μm and has the Young's modulus in the range of 1,000 MPa to 10,000 MPa. The soft and flexible protective layer 107 forms a buffer layer between the die 113 and the conductive layer formed on the surface of the protective layer, so that the conductive layer on the surface of the protective layer does not excessively press the die 113 and the die 113 is prevented from being broken under pressure of the thick and heavy conductive layer during the chip is used. Meanwhile, the protective layer 107 has a sufficient strength, so that the protective layer 107 provides sufficient support for the thick and heavy conductive layer.

In the case that the protective layer 107 has the Young's modulus in the range of 1,000 MPa to 20,000 MPa, especially in the case that the protective layer 107 has the Young's modulus in the range of 4,000 MPa to 8,000 MPa and has the thickness in the range of 20 μm to 50 μm, due to material properties of the protective layer 107, the protective layer 107 effectively protects the die against a pressure from a pin of a die bonder machine during a subsequent process of transferring the die.

The die transferring process is a reconstruction process of arranging and adhering the die 113 which has underwent the cutting and separating process onto the carrier 117; the die transferring process adopts the die bonder machine; the die bonder machine includes the pin; the die 113 on the wafer 100 is jacked up by the pin, and the die 113 which is jacked up is sucked by a bonder head, and then is transferred and bonded to the carrier 117.

During the process that the pin jacks up the die 113, the die 113, especially the thin die 113, is brittle and is easily broken under the jacking pressure of the pin, so the protective layer 107 having the above material properties protects the brittle die 113 to maintain integrity of the die 113 even under a relatively large jacking pressure.

In a preferred embodiment, the protective layer 107 is an organic/inorganic composite material layer including filler particles. For example, the filler particles are inorganic oxide particles. For example, the filler particles are $SiO_2$ particles. In one embodiment, the filler particles in the protective layer 107 are two or more different types of inorganic oxide particles, for example, $SiO_2$ particles and $TiO_2$ particles mixed with each other. Preferably, the filler particles in the protective layer 107 such as the inorganic oxide particles, e.g., $SiO_2$ particles, e.g., $SiO_2$ particles and $TiO_2$ particles mixed with each other, are spherical or spheroidal. In a preferred embodiment, the filler particles in the protective layer 107 such as the inorganic oxide particles, e.g., $SiO_2$ particles, e.g., $SiO_2$ particles and $TiO_2$ particles mixed with each other, have a fill amount of 50% or more.

An organic material has advantages of easy operation and easy application, and the die 113 to be packaged is made of an inorganic material such as silicon; if the protective layer 107 is only made of the organic material, a difference between material properties of the organic material and material properties of the inorganic material may increase a difficulty in the packaging process and affect a packaging effect. By employing the organic/inorganic composite material in which the inorganic particles are added to the organic material, the material properties of the organic material is modified, so that the material of the protective layer 107 has properties of both the organic material and the inorganic material.

In a preferred embodiment, in the case that T<Tg, the protective layer 107 has a coefficient of thermal expansion in a range of 3 ppm/K to 10 ppm/K; in a preferred embodiment, the protective layer 107 has a coefficient of thermal expansion of 5 ppm/K; in a preferred embodiment, the protective layer 107 has a coefficient of thermal expansion of 7 ppm/K; and in a preferred embodiment, the protective layer 107 has a coefficient of thermal expansion of 10 ppm/K.

In the subsequent molding process, the die 113 applied with the protective layer 107 expands and contracts correspondingly during heating and cooling processes of the molding process; in the case that the protective layer 107 has the coefficient of thermal expansion in the range of 3 ppm/K to 10 ppm/K, the protective layer 107 and the die 113 maintain a relatively uniform degree of expansion and contraction, so that an interface stress is not easily caused at a bonding interface between the protective layer 107 and the die 113, and thus the bonding between the protective layer 107 and the die 113 is not easily destroyed and the packaged chip structure is more stable.

The chip after being packaged often needs to undergo a thermal cycle during being used; in the case that the protective layer 107 has the coefficient of thermal expansion in the range of 3 ppm/K to 10 ppm/K, which is the same as or similar to the coefficient of thermal expansion of the die 113, the protective layer 107 and the die 113 maintain a relatively uniform degree of expansion and contraction in the thermal cycle, so that accumulation of interface fatigue at the interface between the protective layer 107 and the die 113 is avoided, and thus the packaged chip becomes more durable and a service life of the packaged chip is prolonged.

On the other hand, if the coefficient of thermal expansion of the protective layer is further reduced, the composite material of the protective layer 107 has to be filled with too many filler particles and the Young's modulus of the material is increased while the coefficient of thermal expansion is further reduced, so that the flexibility of the protective layer is reduced, resulting in excessively strong rigidity but a poor buffering effect of the protective layer 107. It is most preferable to limit the coefficient of thermal expansion of the protective layer to be 5 ppm/k to 10 ppm/k.

In a preferred embodiment, the filler particles in the protective layer 107 (for example, the inorganic oxide particles, such as $SiO_2$ particles) preferably have a diameter of less than 3 μm; preferably, the filler particles in the protective layer 107 (for example, the inorganic oxide particles, such as $SiO_2$ particles) have a diameter between 1 μm and 2 μm.

Controlling the diameter of the filler particles to be less than 3 μm facilitates the protective layer opening formed in the protective layer 107 by a laser patterning process to have a smoother side wall, so that a conductive material is sufficiently filled into a protective layer opening 109 in a conductive material filling process, to avoid a case that, due to a side wall 109c of the protective layer opening 109 having large-sized unevenness, the protective layer opening 109 cannot be filled by the conductive material at a lower side of the side wall that is shielded by a protrusion, and further avoid a case that a conductive property of the filled via 111 is adversely affected.

Meanwhile, by controlling the diameter of the filler particles to be 1 μm to 2 μm, the filler particles with such small diameter will be exposed during the laser patterning process, so that the side wall 109c of the protective layer opening has a certain roughness; in this case, the side wall having a certain roughness and the conductive material have a larger contact area therebetween and thus contact each other more closely, so as to form a filled via 111 with better conductivity.

The above-described diameter of the filler particles is an average value of the diameters of the filler particles.

In a preferred embodiment, the protective layer 107 has a tensile strength in a range of 20 MPa to 50 MPa; and in a preferred embodiment, the protective layer 107 has a tensile strength of 37 MPa.

Optionally, after the process of applying the protective layer 107 to the wafer active surface 1001, the wafer back surface 1002 is ground to thin the wafer 100 to a desired thickness.

Modern electronic devices are small and lightweight, and thus the chip has a tendency of becoming thinner; in the step, the wafer 100 sometimes needs to be thinned to a very small thickness. However, it is very difficult to process and transfer the thin wafer 100, and a process of grinding and thinning the thin wafer 100 is also difficult, so it is usually difficult to thin the wafer 100 to a desired thickness. In the case that the surface of the wafer 100 has the protective layer 107, the protective layer 107 having the above material properties supports the wafer 100, so that the difficulties in processing, transferring and thinning the wafer 100 are reduced.

Figure 3A:
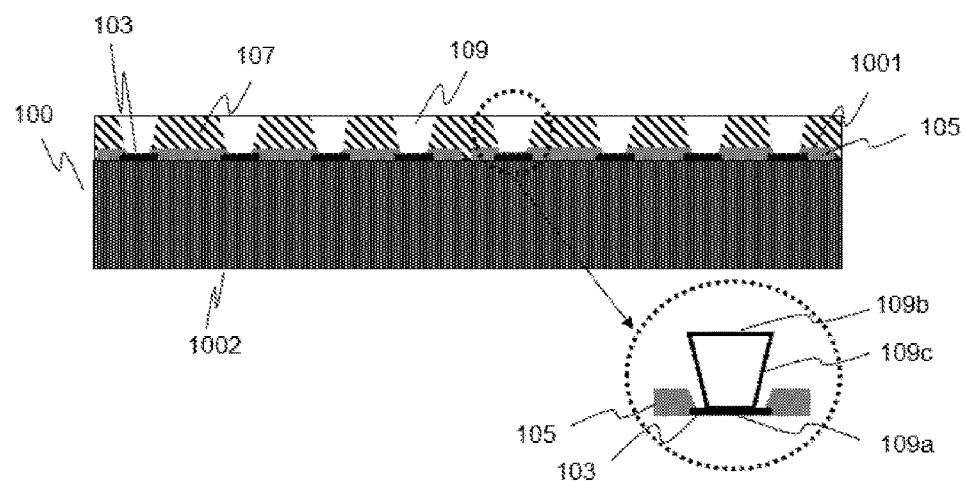
FIG. 3a is a schematic diagram of the semiconductor wafer formed with protective layer openings according to the exemplary embodiment of the present disclosure.

As shown in FIG. 3a, the protective layer opening 109 is formed in the surface of the protective layer 107.

The protective layer opening 109 is formed in the protective layer 10 at a position corresponding to the die pads 103 provided on the wafer active surface 1001, to expose the die pads 103 provided on the wafer active surface 1001.

Preferably, the protective layer openings 109 correspond to the die pads 103 provided on the wafer active surface 1001 in a one-to-one manner.

Optionally, each protective layer opening 109 of at least a part of the protective layer openings 109 corresponds to a plurality of die pads 103.

Optionally, at least a part of the die pads 103 correspond to a plurality of protective layer openings 109.

Optionally, at least a part of the protective layer openings 109 have no corresponding die pads 103, or at least a part of the die pads 103 have no corresponding protective layer openings 109.

Preferably, the protective layer opening is formed by a laser patterning process.

In the process of forming the protective layer opening 109 by the laser patterning process, the conductive cover layer formed on the die pads 103 in the chemical plating process protects the die pads 103 provided on the wafer active surface 1001 from being damaged by laser.

Preferably, as shown by a partially enlarged view in FIG. 3a, a gap is between a lower surface 109a of the protective layer opening and the insulating layer 105; and/or, the lower surface 109a of the protective layer opening is located at a position close to a central portion of the die pads 103.

In a preferred embodiment, the protective layer opening 109 has a shape such that an area of an upper surface 109b of the protective layer opening is larger than an area of the lower surface 109a of the protective layer opening, and an area ratio of the lower surface 109a to the upper surface 109b is 60% to 90%.

In this case, the side wall 109c of the protective layer opening has a slope which facilitates filling of the conductive material, so that the conductive material is uniformly and continuously formed on the side wall during a filling process.

Figure 3B:
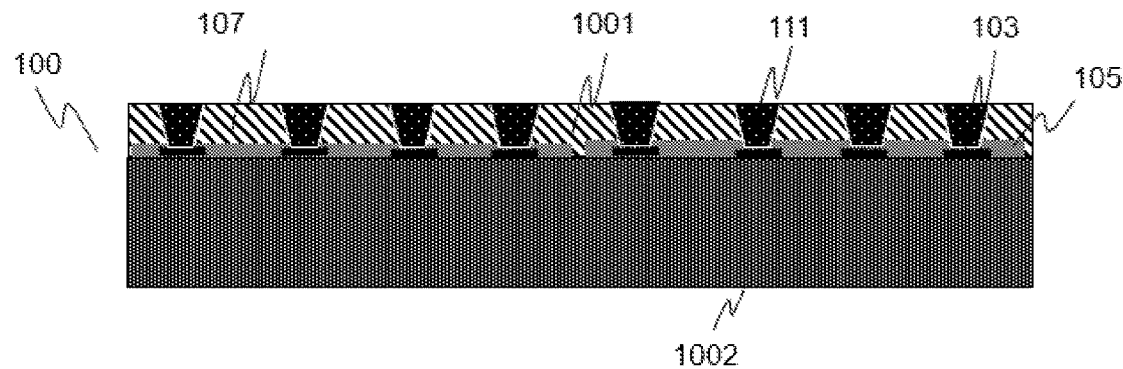
FIG. 3b is a schematic diagram of the semiconductor wafer formed with conductive filled vias according to the exemplary embodiment of the present disclosure.

Optionally, as shown in FIG. 3b, a conductive medium is filled in the protective layer opening 109 such that the protective layer opening 109 becomes the filled via 111; at least one of the conductive filled vias 111 are connected with the die pads 103 provided on the wafer active surface 1001, so that the conductive filled vias 111 lead out the die pads 103 provided on the wafer active surface 1001 unilaterally to the surface of the protective layer. The protective layer surrounds the filled via 111. The conductive medium for example is made of a material such as gold, silver, copper, tin, aluminum and the like, or a combination thereof, or other suitable conductive materials; the conductive medium is filled in the protective layer opening 109 to form the filled via 111 by PVD, CVD, sputtering, electrolytic electroplating, electrodeless electroplating, or other suitable metal deposition processes.

The protective layer opening 109 is completely filled by the conductive medium; or the protective layer opening 109 is partially filled by the conductive medium so that the protective layer opening 109 has only a layer of conductive material formed therein, as long as the layer of conductive material is possible to be electrically connected with the conductive layer. Accordingly, it should be understood that, it is not necessary to form the filled via 111 by completely filling the protective layer opening, as along as the protective layer opening has the conductive medium and the conductive medium is possible to be electrically connected with the conductive layer.

By previously forming the protective layer opening 109 in the protective layer 107 and/or filling the conductive medium in the protective layer opening 109, the die pads 103 provided on the wafer active surface 1001 is accurately positioned by the protective layer opening 109; further, by providing an area of the protective layer opening 109 to be smaller and a distance between the openings to be smaller, traces formed in a subsequent process are arranged more tight without worrying about a positional deviation problem of the die pads 103.

Figure 4:
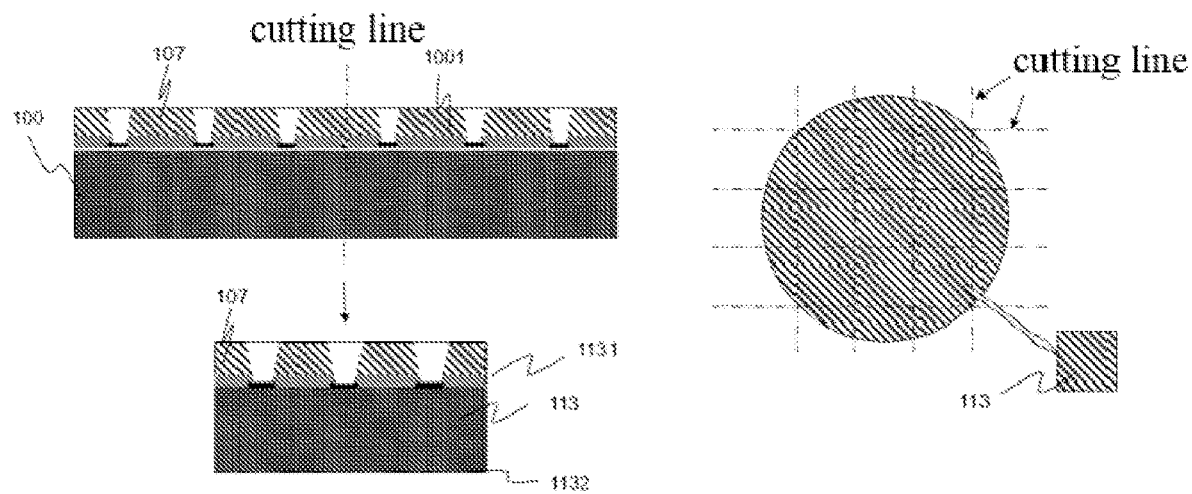

As shown in FIG. 4, the wafer 100 applied with the protective layer 107 is cut along a cutting line, to obtain a plurality of dies 113 formed with a protective layer. The die 113 has the die active surface 1131 and the die back surface 1132.

In one embodiment, the wafer 100 having the protective layer 107 as shown in FIG. 2 is cut to form the die 113.

In one embodiment, the wafer 100 having the protective layer 107 and the protective layer opening 109 as shown in FIG. 3a is cut to form the die 113.

In one embodiment, the wafer 100 having the protective layer 107 and the filled via 111 as shown in FIG. 3b is cut to form the die 113.

Due to the material properties of the protective layer, the die 113 which is separated out in the process of cutting the wafer 100 has no burrs and chippings.

In one embodiment, before the step of cutting the wafer 100 to separate out the dies 113, the method further comprises: performing plasma surface treatment on the surface, applied with the protective layer 107, of the wafer 100 to increase surface roughness, so that adhesiveness of the die 113 to the carrier 117 in a subsequent process is increased and thus position shift of the die under the package pressure is less likely to occur.

It should be understood that, if the process permits, the protective layer for example is formed on the die active surface 1131 of each die 113 after the wafer 100 is cut into the dies 113 to be packaged according to specific practical situations.

Figure 5A:
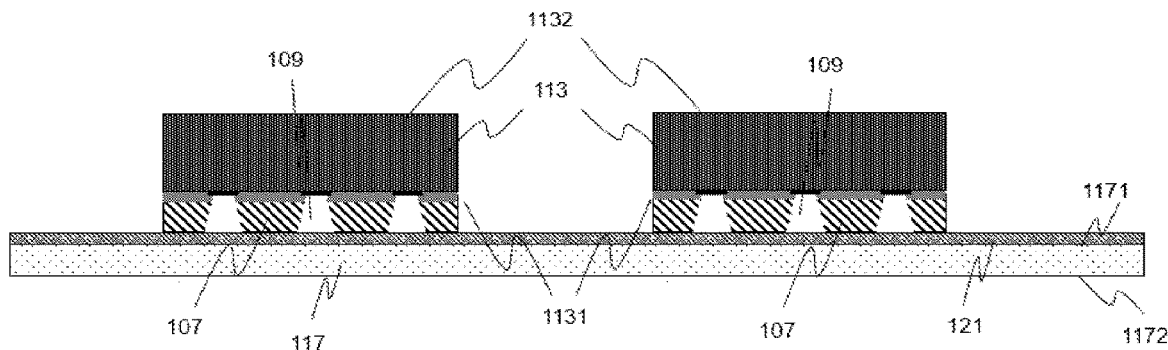
FIG. 5a is a schematic diagram of adhering the die onto a carrier according to the exemplary embodiment of the present disclosure.

As shown in FIG. 5a, the carrier 117 is provided, and the carrier 117 has a carrier front surface 1171 and a carrier back surface 1172; the die 113 separated out is arranged at a predetermined position on the carrier front surface 1171, the die active surface 1131 faces the carrier 117, and the die back surface 1132 faces away from the carrier 117.

The carrier 117 for example has a shape of a circle, a triangle, a quadrangle or any other shape; the carrier 117 for example has a size of a small-sized wafer substrate, or has various sizes, particularly is a large-sized rectangular carrier; and the carrier 117 for example is made of metal, non-metal, plastic, resin, glass and stainless steel, etc. Preferably, the carrier 117 is a large-sized quadrangular stainless steel panel.

The carrier 117 has the carrier front surface 1171 and the carrier back surface 1172, and the carrier front surface 1171 is a flat surface.

In one embodiment, the die 113 is bonded and fixed onto the carrier 117 by the adhesive layer 121.

The adhesive layer 121 for example is formed on the carrier front surface 1171 by lamination, printing, spraying and coating, etc. In order to facilitate separation of the carrier 117 from the die 113 whose back side has been packaged in a subsequent process, the adhesive layer 121 is preferably made of a material capable of being easily separated, for example, a thermal-releasing material.

Preferably, a position mark for arranging the die 113 is previously formed on the carrier 117, the mark is formed on the carrier 117 by laser, mechanical patterning, etc., and meanwhile, an alignment mark is provided on the die 113 to aim for and align with a position for adhering on the carrier 117 during adhering.

Figure 5B:
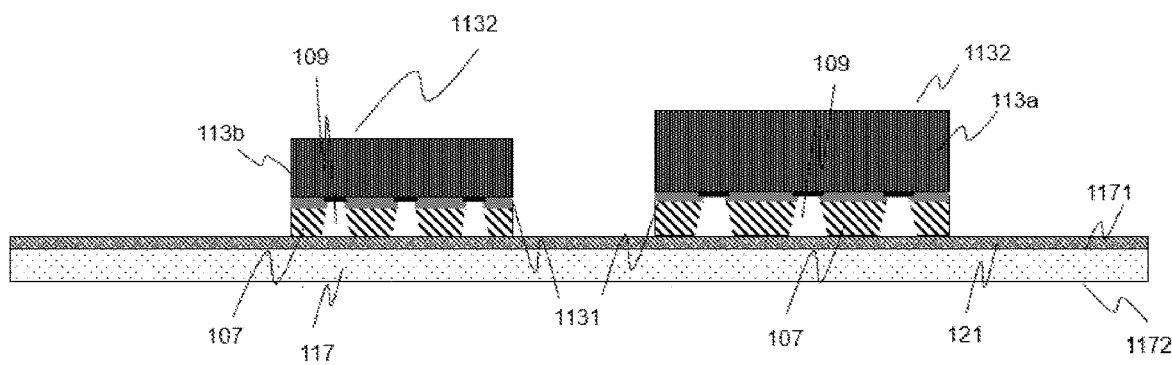
FIG. 5b is a schematic diagram of bonding a combination of the dies onto the carrier according to the exemplary embodiment of the present disclosure.

Optionally, as shown in FIG. 5b, in a single packaging process, a plurality of dies 113a and 113b, particularly, a plurality of dies 113a and 113b having different functions (which are shown as two in the drawing, or may be more than two dies) are arranged on the carrier 117 according to actual product requirements, then are packaged, and further are cut into a plurality of package bodies after packaging is completed; and thus, one package body includes the plurality of dies 113a and 113b so as to form a multi-chip module (MCM), and positions of the plurality of dies 113a and 113b may be freely set according to actual product requirements.

The die 113 arranged on the carrier 117 for example is in a form of the die 113 formed by cutting the wafer 100 having the protective layer 107 as shown in FIG. 2.

The die 113 arranged on the carrier 117 for example is in a form of the die 113 formed by cutting the wafer 100 having the protective layer 107 and the protective layer opening 109 as shown in FIG. 3a; after the die 113 formed with the protective layer 107 and the protective layer opening 109 is adhered onto the adhesive layer 121 of the carrier 117, the protective layer opening 109 is in a hollow state.

The die 113 arranged on the carrier 117 for example is a form of the die 113 formed by cutting the wafer 100 having the protective layer 107 and the filled via 111 as shown in FIG. 3b.

Figure 6:
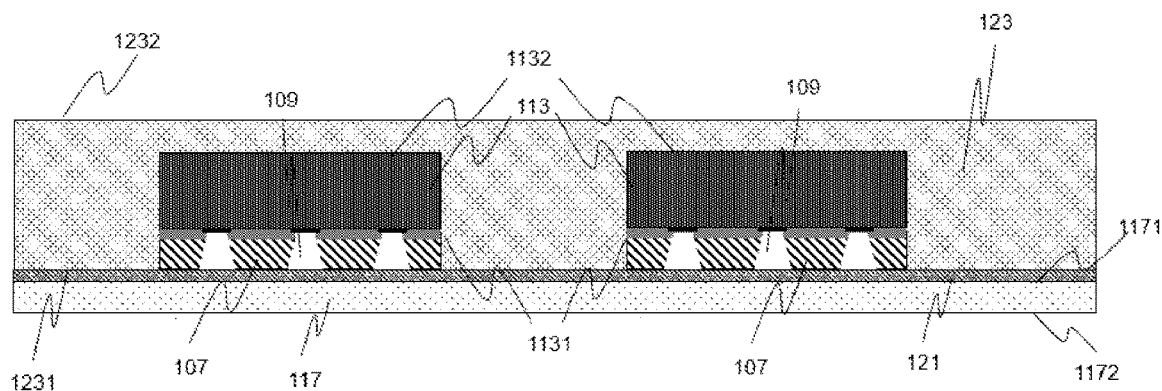

As shown in FIG. 6, an encapsulation layer 123 is formed.

The encapsulation layer 123 is formed on all exposed surface of the die 113 to be packaged and the exposed surface of the carrier front surface 1171 or the adhesive layer 121. The encapsulation layer 123 is used to completely encapsulate the carrier front surface 1171 and the die 113, so as to reconstruct a flat-plate structure; after the carrier 117 is stripped off, a subsequent packaging step is continued on the reconstructed flat-plate structure.

A surface of the encapsulation layer 123 that is in contact with the carrier front surface 1171 or the adhesive layer 121 is defined as an encapsulation layer front surface 1231. A surface of the encapsulation layer 123 that faces away from the carrier front surface 1171 or the adhesive layer 121 is defined as an encapsulation layer back surface 1232.

Preferably, the encapsulation layer front surface 1231 and the encapsulation layer back surface 1232 are substantially flat and parallel to the carrier front surface 1171.

In one embodiment, the encapsulation layer 123 is made of an organic/inorganic composite material by compression molding.

Preferably, the encapsulation layer 123 has a coefficient of thermal expansion in a range of 3 ppm/K to 10 ppm/K; in a preferred embodiment, the encapsulation layer 123 has a coefficient of thermal expansion of 5 ppm/K; in another preferred embodiment; the encapsulation layer 123 has a coefficient of thermal expansion of 7 ppm/K; and in still another preferred embodiment, the encapsulation layer 123 has a coefficient of thermal expansion of 10 ppm/K.

Preferably, the encapsulation layer 123 and the protective layer 107 have a substantially same coefficient of thermal expansion.

The coefficient of thermal expansion of the encapsulation layer 123 is selected to be 3 ppm/K to 10 ppm/K, and is selected to be the same as or similar to the coefficient of thermal expansion of the protective layer 107; during heating and cooling processes of the molding process, the protective layer 107 and the encapsulation layer 123 have a uniform degree of expansion and contraction, so that an interface stress is not easily caused between the protective layer 107 and the encapsulation layer 123; and such low coefficient of thermal expansion of the encapsulation layer allows the encapsulation layer, the protective layer and the die to have coefficients of thermal expansion close to one another, so that the encapsulation layer 123, the protective layer 107 and the die 113 are bonded closely at the interfaces therebetween, to avoid their separations at the interfaces therebetween.

The packaged chip usually needs to undergo the thermal cycle during being used; in the case that the protective layer 107, the encapsulation layer 123 and the die 113 have coefficients of thermal expansion close to one another, the protective layer 107, the encapsulation layer 123 and the die 113 have little interface fatigue in the thermal cycle, and an interface gap is less likely to occur between the protective layer 107, the encapsulation layer 123 and the die 113, so that a service life of the chip is prolonged and an application field of the chip is widen.

A difference in the coefficients of thermal expansion between the die 113 and the encapsulation layer 123 may cause warpage of the panel after the molding process is completed; due to the warpage phenomenon, it is difficult to accurately position the die 113 in the panel in a subsequent process of forming the conductive layer, which thus has a great impact on the process of forming the conductive layer.

Particularly, in a large panel packaging process, because a size of the panel is relatively large, even slight panel warpage may cause the die in an outer peripheral portion of the panel that is away from a center of the panel to generate a greater position change as compared with the position of the die before being molded; so in the large panel packaging process, solving the warpage problem becomes one of key points of the whole process; and the warpage problem even limits magnification development of the size of the panel and becomes a technical barrier in the packaging process of the large-sized panel.

The coefficients of thermal expansion of the protective layer 107 and the encapsulation layer 123 are limited to the range of 3 ppm/K to 10 ppm/K, and preferably, the encapsulation layer 123 and the protective layer 107 have the substantially same coefficient of thermal expansion, so that occurrence of warpage of the panel is effectively avoided and the packaging process of the large panel is implemented.

Meanwhile, during the molding process, the package pressure exerts a pressure onto the back side of the die 113, the pressure tends to press the die 113 into the adhesive layer 121, so that the die 113 sinks into the adhesive layer 121 in the process of forming the encapsulation layer 123; after the encapsulation layer 123 is formed, the die 113 and the encapsulation layer front surface 1231 are not located in a same plane, and the surface of the die 113 protrudes beyond the encapsulation layer front surface 1231 to form a stepped structure; during a subsequent process of forming the conductive layer, a trace 125 also has a corresponding stepped structure, which makes the package structure unstable.

In the case that the die active surface 1131 has the protective layer 107 with the above material properties, the protective layer 107 acts as a buffer under the package pressure to avoid the die 113 from sinking into the adhesive layer 121, so as to avoid generation of the stepped structure on the encapsulation layer front surface 1231.

Figure 7A:
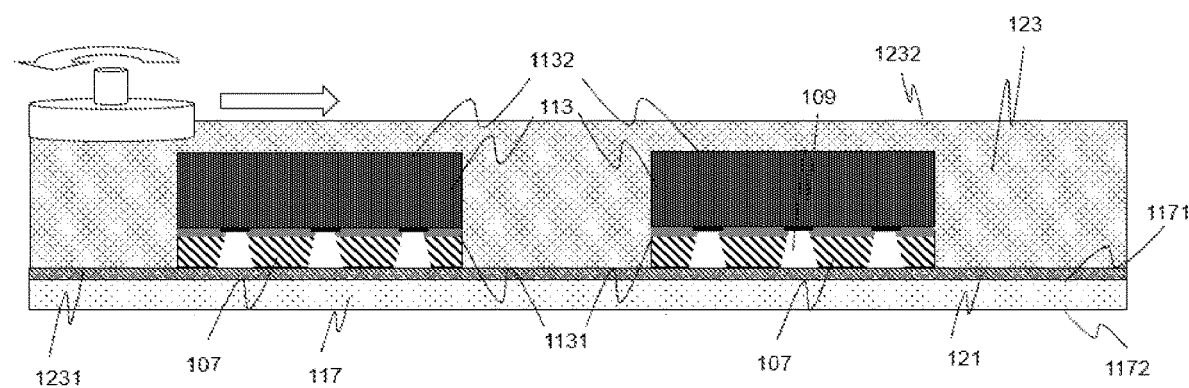
FIG. 7a is a schematic diagram of thinning the encapsulation layer according to the exemplary embodiment of the present disclosure.

As shown in FIG. 7a, a thickness of the encapsulation layer 123 is thinned by grinding or polishing the encapsulation layer back surface 1232.

Figure 7B:
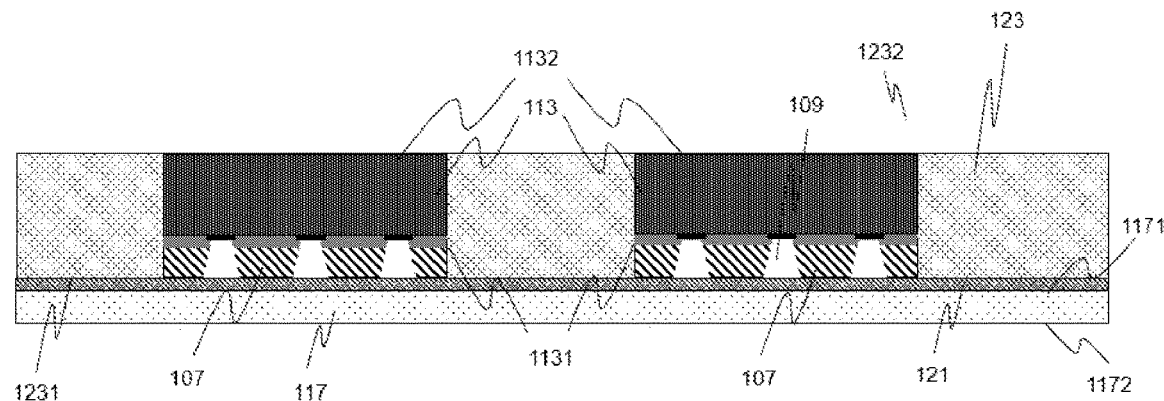
FIG. 7b is a schematic diagram of thinning the encapsulation layer to expose a die back surface of the die according to the exemplary embodiment of the present disclosure.

In one embodiment, as shown in FIG. 7b, the thickness of the encapsulation layer 123 is thinned to the die back surface 1132 of the die 113 to expose the die back surface 1132. The packaged chip structure is as shown in FIG. 13b.

Figure 8:
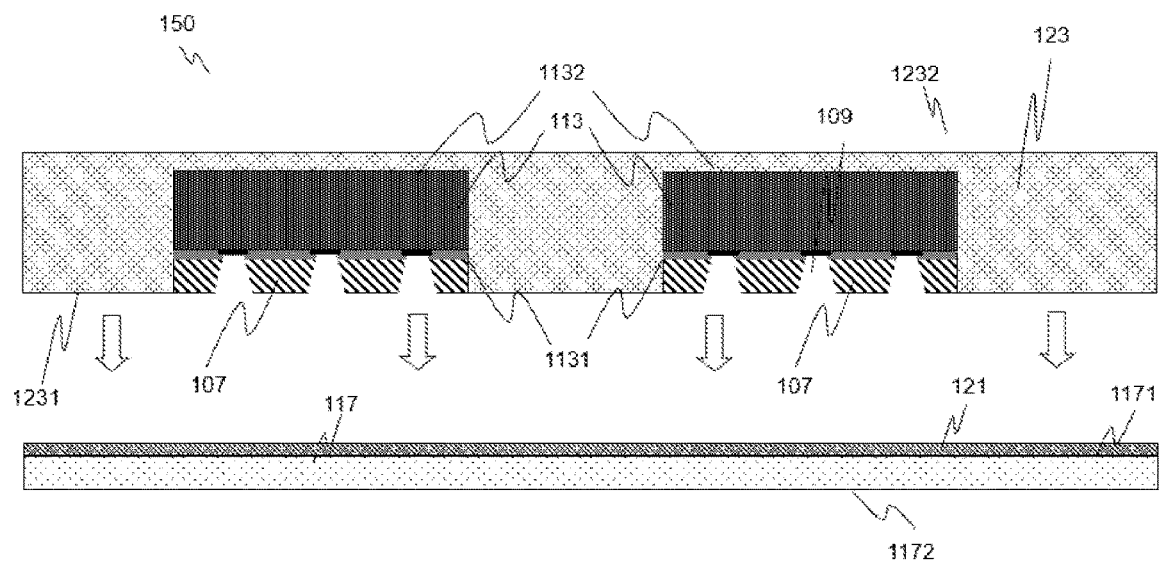

As shown in FIG. 8, the carrier 117 is stripped off to expose the encapsulation layer front surface 1231 and the protective layer 107.

In one embodiment, if the die 113 arranged on the carrier 117 is in the form of the die 113 having the protective layer 107 and the protective layer opening 109 as shown in FIG. 3a, the protective layer opening 109 is also exposed after the carrier 117 is stripped off.

In one embodiment, if the die 113 arranged on the carrier 117 is in the form of the die 113 formed by cutting the wafer 100 having the protective layer 107 but having not had the protective layer opening 109 formed in the protective layer 107 as shown in FIG. 2, the method further comprises a step of forming the protective layer opening in the protective layer 107 provided on the die 113 packaged by the encapsulation layer 123 after the carrier 117 is stripped off.

In one embodiment, if the die 113 arranged on the carrier 117 is in the form of the die 113 formed by cutting the wafer 100 having the protective layer 107 and the filled via 111 as shown in FIG. 3b, the filled via 111 is also exposed after the carrier 117 is stripped off.

After the carrier 117 is removed, a structure in which the encapsulation layer 123 encapsulates the die 113 is defined as the panel assembly 150.

Figure 9:
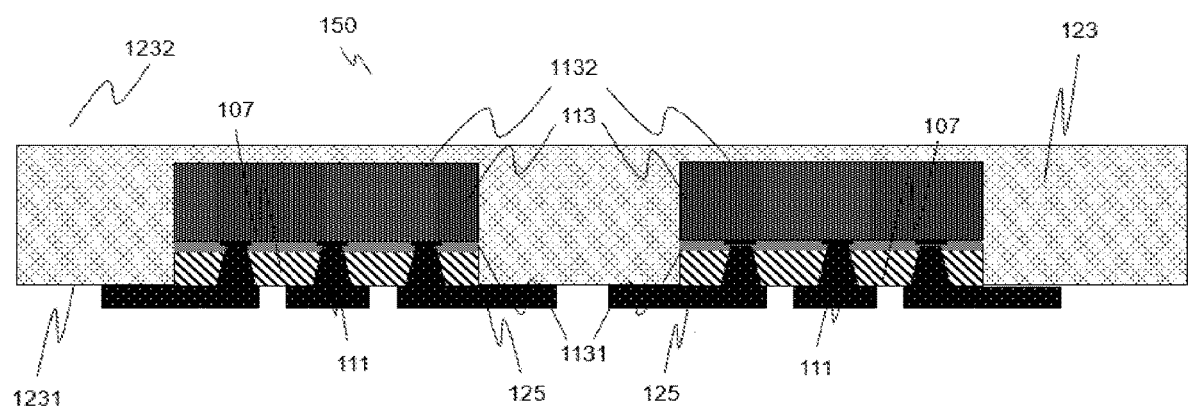
Figure 10:
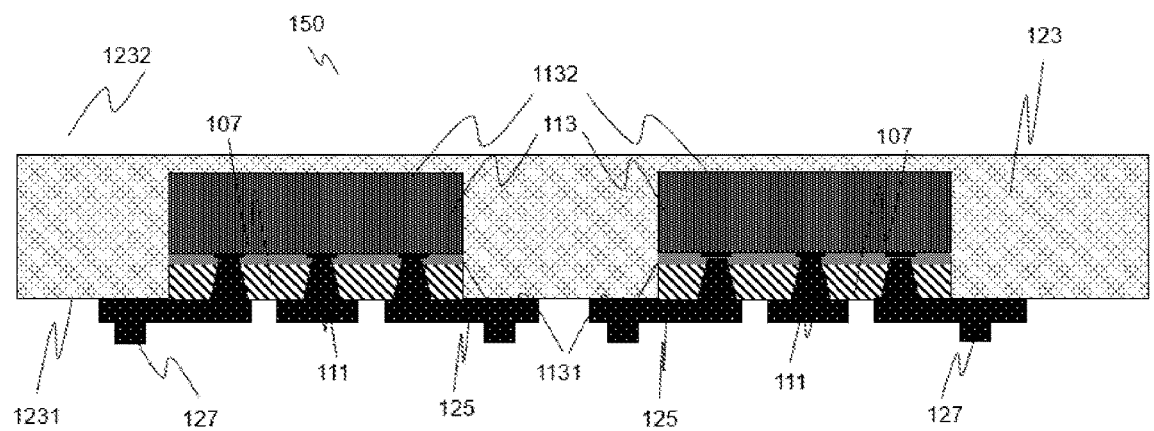

FIG. 9 and FIG. 10 show one embodiment of a process of forming the conductive filled vias and the patterned conductive layer on the die 113 within the encapsulation layer 123.

If the protective layer 107 on the surface of the die 113 packaged within the encapsulation layer 123 has not had the filled via 111 formed, the conductive medium is filled in the protective layer opening 109 such that the protective layer opening 109 becomes the filled via 111; the filled via 111 is electrically connected with the die pads 103 provided on the wafer active surface 1001, so that the filled via 111 leads out the die pads 103 provided on the wafer active surface 1001 unilaterally to the surface of the protective layer; and the protective layer surrounds the filled via 111. The conductive medium for example is made of a material such as gold, silver, copper, tin, aluminum and the like, or a combination thereof, or other suitable conductive materials; the conductive medium is filled in the protective layer opening 109 to form the filled via 111 by physical vapor deposition (PVD), chemical vapor deposition (CVD), sputtering, electrolytic electroplating, electrodeless electroplating, or other suitable metal deposition processes.

The protective layer opening 109 is completely filled by the conductive medium; or the protective layer opening 109 is partially filled by the conductive medium so that the protective layer opening 109 has only a layer of conductive material formed therein, as long as the layer of conductive material is possible to be electrically connected with the conductive layer. Accordingly, it should be understood that, it is not necessary to form the filled via 111 by completely filling the protective layer opening, as along as the protective layer opening has the conductive medium and the conductive medium is possible to be electrically connected with the conductive layer.

A trace 125 is formed on the die 113 within the encapsulation layer 123; at least one of the traces 125 are formed on the surface of the protective layer 107 provided on the die active surface 1131, and are electrically connected with at least a part of the filled via 111; in one embodiment, the trace 125 extends along the surface of the protective layer 107 and the encapsulation layer front surface 1231, and extends to an edge of the chip package body after the packaging is completed; and the packaged chip structure is as shown in FIG. 13b. The trace 125 extends to the edge of the chip package body, and in this case, the trace 125 covers and connects interfaces between the protective layer 107 and the encapsulation layer 132, so that stability of the packaged chip structure is increased.

The trace 125 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

Preferably, the filled via 111 and the trace 125 are formed in a same step for forming metal layer.

Of course, optionally, the filled via 111 is firstly formed and then the trace 125 is formed.

FIG. 10 shows that a stud 127 is formed on a pad or a connection point of the trace 125; the stud 127 for example has a shape of a circle, or may have other shape such as an ellipse, a square, a line and the like. The stud 127 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

The conductive layer comprises the trace 125 and/or the stud 127, and the conductive layer has one layer or a plurality of layers. The conductive layer for example has a fan-out RDL function.

Figure 11A:
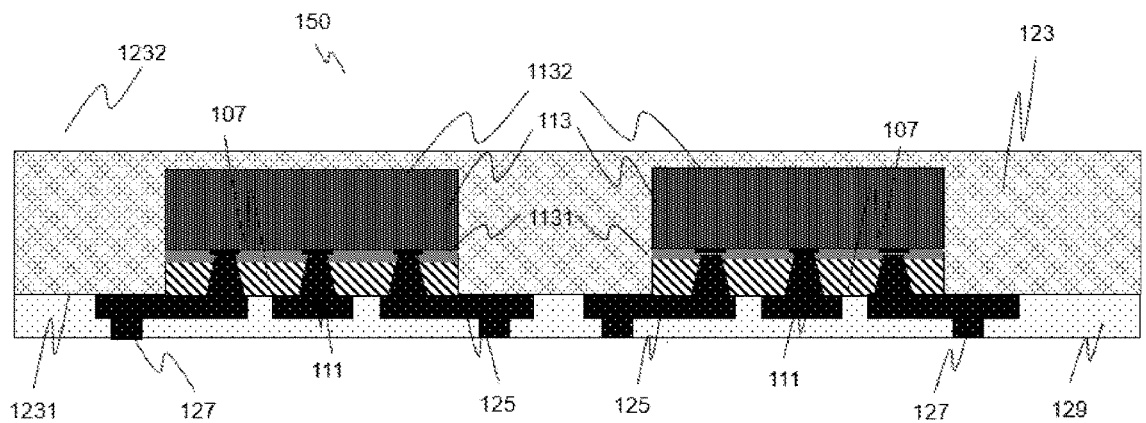
FIG. 11a and FIG. 11b are schematic diagrams of forming a dielectric layer on the panel assembly according to the exemplary embodiment of the present disclosure.
Figure 11B:
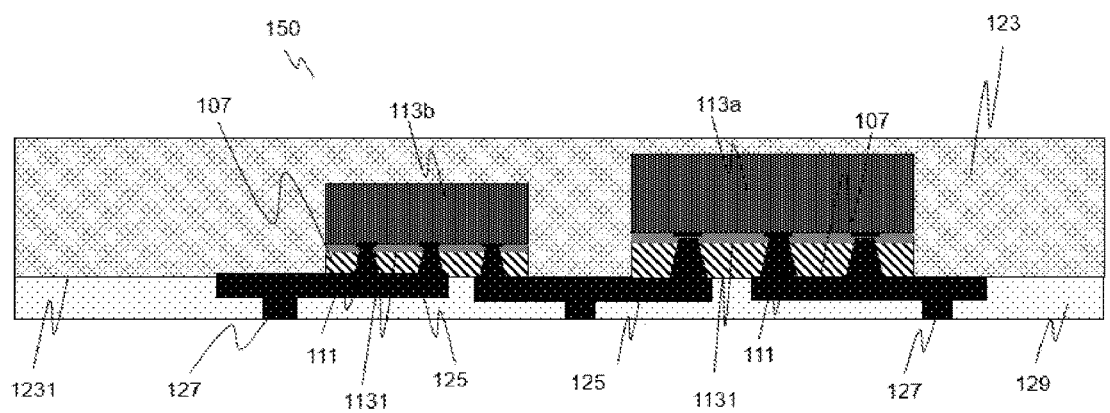

As shown in FIG. 11a and FIG. 11b, a dielectric layer 129 is formed on the conductive layer.

One or more dielectric layers 129 are formed on the surface of the conductive layer by lamination, coating, spraying, printing, molding, or other suitable method.

The dielectric layer 129 for example is made of benzocyclobutene (BCB), polyimide (PI), polybenzoxazole (PBO), Ajinomoto Build up Film (ABF), silicon dioxide, silicon nitride, silicon oxynitride, tantalum pentoxide, aluminum oxide, polymer-based dielectric film, organic polymer film; or is made of an organic composite material, a resin composite material, a macromolecule composite material, a polymer composite material, such as an epoxy resin having a filler, ABF, or other polymer having a suitable filler; or is made of other material having similar insulation and structural properties. In a preferred embodiment, the dielectric layer 129 is made of ABF. The dielectric layer 129 is insulating and plays a role of protecting the conductive layer. In one embodiment, the dielectric layer 129 is applied to have a thickness that is greater than a thickness of the conductive layer, and the conductive layer is exposed by a polishing process; in another embodiment, the dielectric layer 133 is applied to have the thickness that is equal to the thickness of the conductive layer, so that the conductive layer is just exposed after the dielectric layer 129 is applied.

In one embodiment, the steps of FIG. 9 to FIG. 11b are repeated to form a plurality of conductive layers on the die active surface 1131 of the die 113.

Return to steps of FIG. 9 to FIG. 11b. In one embodiment, the step of forming the conductive layer for example is as follows:

Forming the trace 125 on the die active surface 1131 of the die 113;

Forming one or more dielectric layers 129 on the surface of the trace 125 by lamination, coating, spraying, printing, molding, or other suitable method; a height of the dielectric layer 129 being higher than a height of the trace 125, and the trace 125 being completely encapsulated in the dielectric layer 129;

Forming an opening in the dielectric layer 129 at a position corresponding to the pad or the connection point of the trace 125, and forming the stud 127 in the opening.

In still another embodiment, the stud 127 is not formed in the opening, so that the pad or the connection point of the trace 125 of the completed package body is exposed from the opening.

In a preferred embodiment, after the step of applying the dielectric layer 129, an outermost conductive layer is etched and thinned, to form a groove 131 on an outer surface of the dielectric layer 129; and the packaged chip structure is as shown in FIG. 13b.

Optionally, as shown in FIG. 11b, in a single packaging process, a plurality of dies 113a and 113b, particularly, a plurality of dies 113a and 113b having different functions (which are shown as two in the drawing, or may be more than two dies) are packaged into the multi-chip module, and patterns of the conductive layers of the plurality of dies 113a and 113b are designed according to electrical connection needs of actual products. The packaged chip structure is as shown in FIG. 13c.

Figure 12:
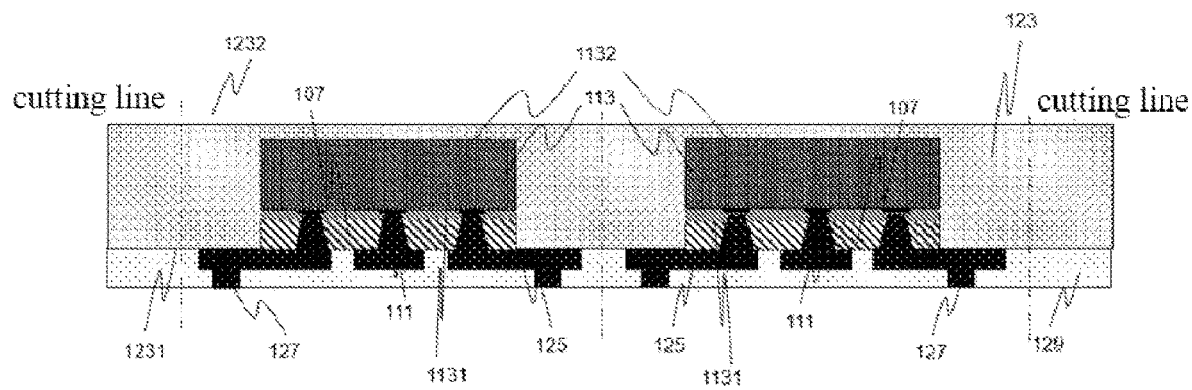

As shown in FIG. 12, the package single body is separated out by cutting to form the packaged chip, and the cutting for example is performed by employing machinery or laser.

Chip package structures may also be provided in the embodiment of the present disclosure. For example, the chip package structures formed using the packaging method described in the above embodiments. Therefore, all the description in the embodiments of the above packaging method are applicable to the chip package structures.

Figure 13A:
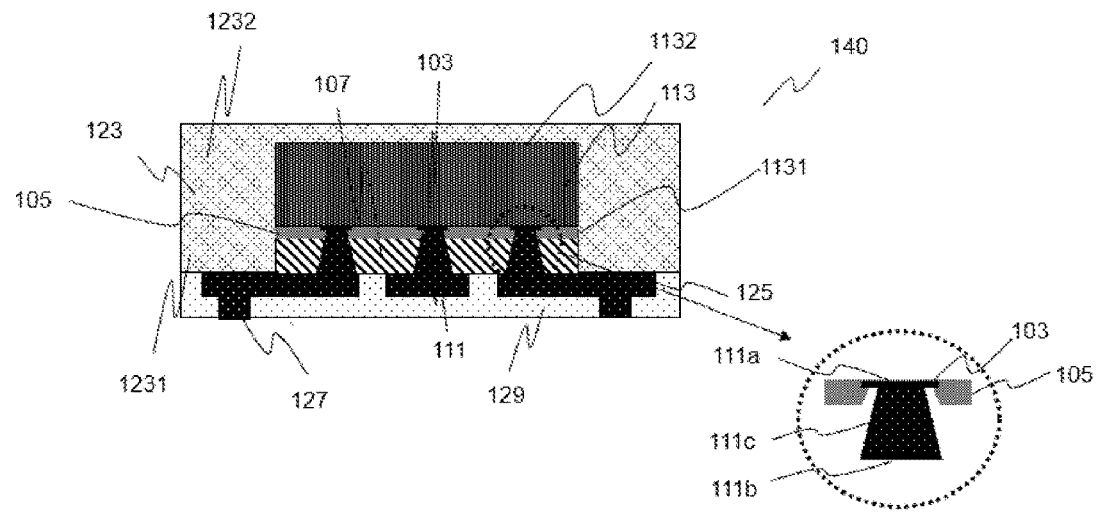
FIG. 13a is schematic diagram of a chip package structure obtained by using the above-described packaging method according to the exemplary embodiment of the present disclosure.
Figure 13B:
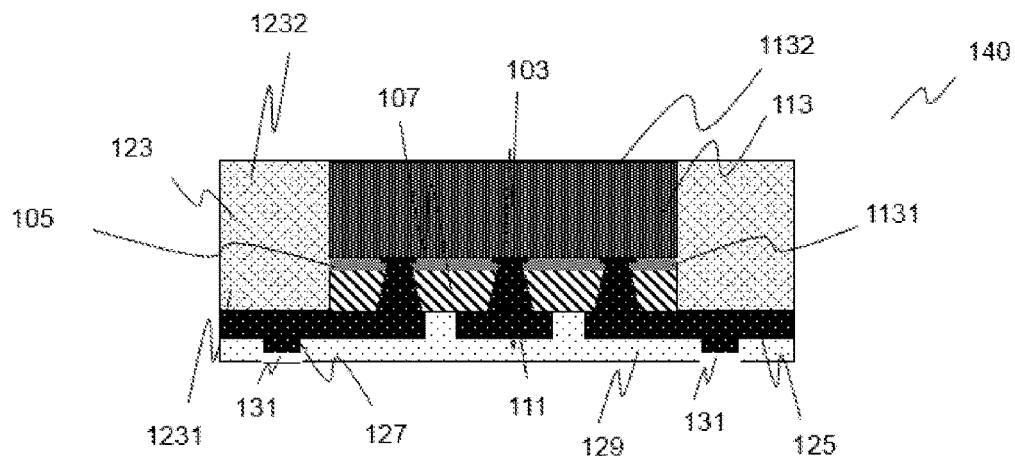
FIG. 13b is a schematic diagram of the chip package structure obtained by using the above-described packaging method according to the exemplary embodiment of the present disclosure.
Figure 13C:
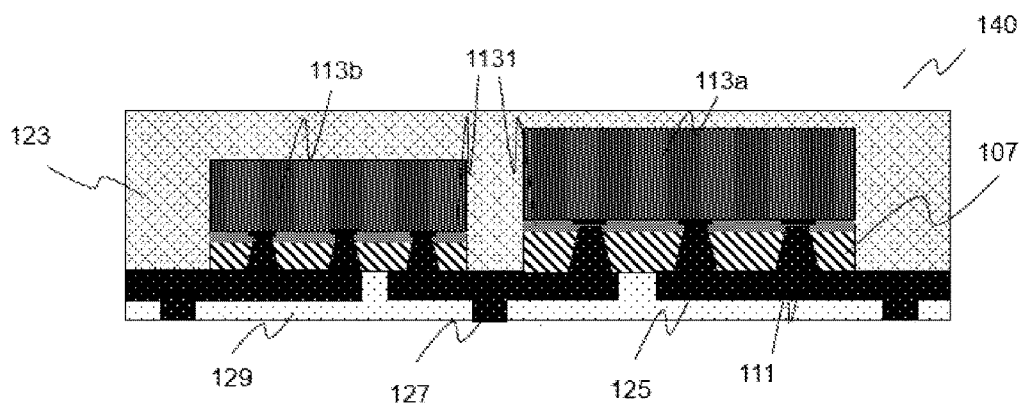
FIG. 13c is a schematic diagram of a chip module package structure obtained by using the above-described packaging method according to the exemplary embodiment of the present disclosure.

FIG. 13a, FIG. 13b and FIG. 13c are schematic diagrams of chip package structures.

FIG. 13a is a schematic diagram of the chip package structure obtained by using the packaging method provided by the exemplary embodiment of the present disclosure.

As shown in the drawing, the chip package structure comprises: the die 113, the die 113 including the die active surface 1131 and the die back surface 1132, the die active surface 1131 including the die pads 103 and the insulating layer 105; the protective layer 107, the protective layer 107 being formed on the die active surface 1131, the conductive filled vias 111 being formed in the protective layer 107, and at least one of the conductive filled vias 111 being electrically connected with at least a part of the die pads 103 to lead out the at least a part of the die pads 103 from the die active surface 1131; the encapsulation layer 123, the encapsulation layer 123 encapsulating the die 113; the conductive layer, at least a part of the conductive layer being formed on the surface of the protective layer 107, the conductive layer being electrically connected with the at least one of the conductive filled vias 111; and the dielectric layer, formed on the conductive layer 125, 127.

In one embodiment, the protective layer 107 has the Young's modulus of any numerical range or value below: 1,000 MPa to 20,000 MPa, 1,000 MPa to 10,000 MPa, 4,000 MPa to 8,000 MPa, 1,000 MPa to 7,000 MPa, 4,000 MPa to 7,000 MPa and 5,500 MPa.

In one embodiment, the protective layer 107 is made of the organic/inorganic composite material.

In one embodiment, the protective layer 107 has the thickness of any numerical range or value below: 15 μm to 50 μm, 20 μm to 50 μm, 35 μm, 45 μm and 50 μm.

In one embodiment, the protective layer 107 has the coefficient of thermal expansion of any numerical range or value below: 3 ppm/K to 10 ppm/K, 5 ppm/K, 7 ppm/K and 10 ppm/K.

In one embodiment, the encapsulation layer 123 has the coefficient of thermal expansion of any numerical range or value below: 3 ppm/K to 10 ppm/K, 5 ppm/K, 7 ppm/K and 10 ppm/K.

In one embodiment, the protective layer 107 and the encapsulation layer 123 have a substantially same coefficient of thermal expansion.

In one embodiment, the protective layer 107 includes the inorganic filler particles; and the inorganic filler particles have the diameter of less than 3 μm, or the inorganic filler particles have the diameter between 1 μm and 2 μm.

In one embodiment, an area ratio of the lower surface 111a of the filled via to the upper surface 111b of the filled via is 60% to 90%.

In one embodiment, the filled via 111 is formed by filling the protective layer opening 109 with the conductive medium.

In one embodiment, the conductive cover layer is formed on the die pads 103.

In one embodiment, as shown by a partially enlarged view in FIG. 13a, a gap is between the lower surface 111a of the filled via and the insulating layer 105.

In one embodiment, as shown by the partially enlarged view in FIG. 13a, the lower surface 111a of the filled via is located at a position close to the central portion of the die pads 103.

In one embodiment, the conductive layer includes the traces 125 and/or the studs 127; at least one of the traces 125 that are closest to the die active surface 1131 are formed on the surface of the protective layer 107, and are electrically connected with the conductive filled vias 111.

The stud 127 is formed on the pad or the connection point of the trace 125.

The conductive layer has one layer or a plurality of layers.

In one embodiment, as shown in FIG. 13b, at least one of the traces 125 that are closest to the die active surface 1131 are formed on the encapsulation layer front surface 1231, and extend to the edge of the package body.

In still another embodiment, as shown in FIG. 13b, the die back surface 1132 is exposed from the encapsulation layer 123.

In yet another embodiment, as shown in FIG. 13b, the surface of the dielectric layer 129 is provided with the groove at a position corresponding to the conductive layer.

In one embodiment, as shown in FIG. 13c, the package structure includes a plurality of dies 113, and the plurality of dies 113 are electrically connected according to product design. Optionally, the plurality of dies 113 are dies having different functions, to form the multi-chip module.

It should be noted that, for the materials, structures or technical effects, etc. which are not mentioned in the descriptions of the package structures, reference may be made to the embodiments of the above packaging methods, and the details are not described herein again.

Figure 14A:
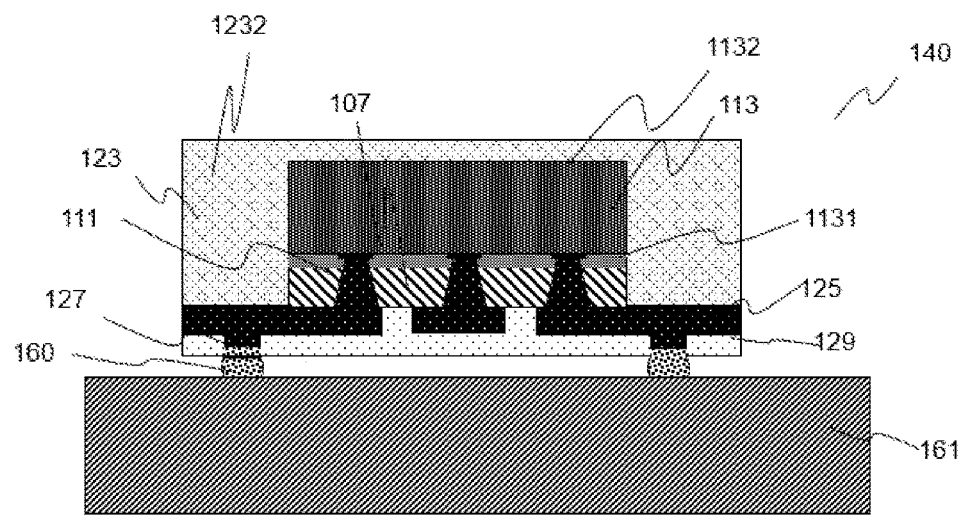
FIG. 14a is a schematic diagram of the packaged chip in use according to the exemplary embodiment of the present disclosure.

FIG. 14a shows a schematic diagram of the packaged chip in use; during the packaged chip is used, the packaged chip is connected to a circuit board or a substrate 161 through a solder 160, and then is connected with other circuit elements.

In the case that the surface of the dielectric layer 129 of the packaged chip has the groove 131, the solder 160 is stably provided and is difficult to shift.

Figure 14B:
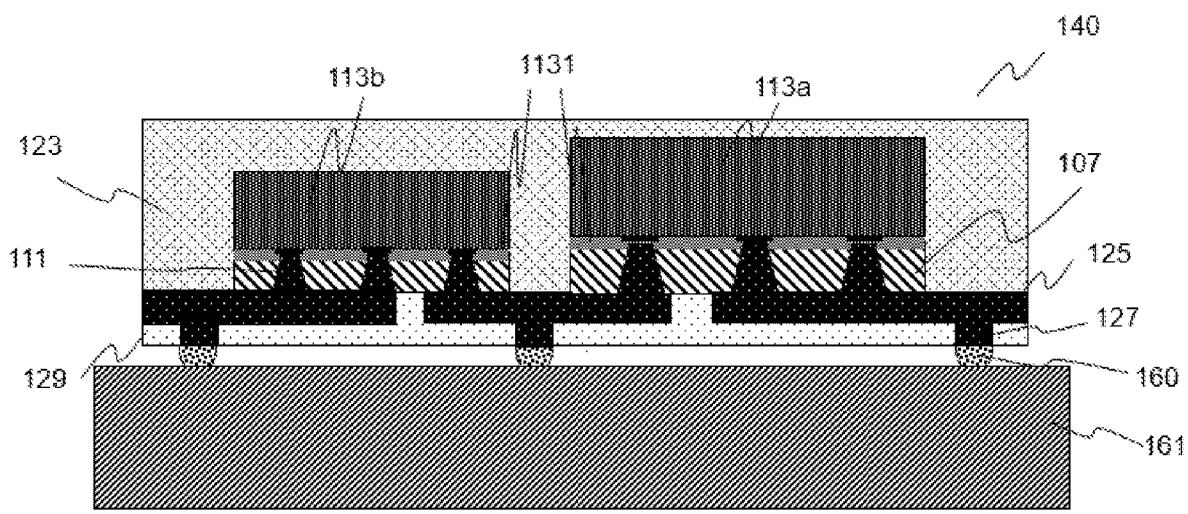
FIG. 14b is a schematic diagram of a packaged chip module in use according to the exemplary embodiment of the present disclosure.

FIG. 14b shows a schematic diagram of the packaged chip in use; during the packaged chip is used, the packaged chip is connected to the circuit board or the substrate 161 through the solder 160, and then is connected with other circuit elements.

The following examples pertain to various embodiments.

According to some embodiments, the present disclosure is intended to provide a chip packaging method and a chip package structure, and the chip packaging method reduces or eliminates warpage in a panel packaging process, lowers a requirement on an accuracy of aligning a die on a panel, reduces a difficulty in the panel packaging process, and makes a packaged chip structure more durable, and thus the present disclosure is especially suitable for large panel-level package and package of a thin chip with a large electric flux.

At least one embodiment in the present disclosure relates to a chip package structure comprising: at least one die; a protective layer, provided on a side having a die active surface of the at least one die, wherein filled via holes are provided in the protective layer, and at least a part of the filled via holes are electrically connected with electrical connection pads provided on the die active surface; a molding layer, the molding layer encapsulating the at least one die; a conductive layer, at least partially provided on a surface of the protective layer, wherein at least a part of the conductive layer is electrically connected with the filled via holes; and a dielectric layer, provided on the conductive layer.

According to some embodiments, the protective layer has a Young's modulus of any numerical range or value below: 1,000 MPa to 20,000 MPa, 1,000 MPa to 10,000 MPa, 4,000 MPa to 8,000 MPa and 5,500 MPa.

According to some embodiments, the protective layer comprises an organic/inorganic composite material.

According to some embodiments, the protective layer has a thickness of any numerical range or value below: 15 μm to 50 μm, 20 μm to 50 μm, 35 μm, 45 μm and 50 μm.

According to some embodiments, the protective layer has a coefficient of thermal expansion of any numerical range or value below: 3 ppm/K to 10 ppm/K, 5 ppm/K, 7 ppm/K and 10 ppm/K.

According to some embodiments, the molding layer has a coefficient of thermal expansion of any numerical range or value below: 3 ppm/K to 10 ppm/K, 5 ppm/K, 7 ppm/K and 10 ppm/K.

According to some embodiments, the protective layer and the molding layer have a substantially same coefficient of thermal expansion.

According to some embodiments, the protective layer includes inorganic filler particles.

According to some embodiments, the inorganic filler particles have a diameter of less than 3 μm.

According to some embodiments, the inorganic filler particles have a diameter between 1 μm and 2 μm.

According to some embodiments, the filled via holes are provided by filling protective layer openings with a conductive medium, and the protective layer openings are provided in the protective layer.

According to some embodiments, each filled via hole has a lower surface and an upper surface, and an area ratio of the lower surface of the filled via hole to the upper surface of the filled via hole is 60% to 90%.

According to some embodiments, a gap is between the lower surface of the filled via hole and an insulating layer provided on the die active surface.

According to some embodiments, the lower surface of the filled via hole is located at a position close to a central portion of one of the electrical connection pads.

According to some embodiments, the conductive layer includes traces and/or studs; at least one of the traces that are closest to the die active surface are provided on the protective layer, and electrically connected with the filled via holes; and the conductive layer has one or more layers.

According to some embodiments, a conductive cover layer is provided on the electrical connection pads.

According to some embodiments, at least one of the traces that are closest to the die active surface are provided on a molding layer front surface of the molding layer and extends to an edge of a package body the chip package structure.

According to some embodiments, a die back surface of the at least one die is exposed from the molding layer.

According to some embodiments, a surface of the dielectric layer is provided with a groove at a position corresponding to the conductive layer.

According to some embodiments, the at least one die comprises a plurality of dies, and the plurality of dies are electrically connected according to product design.

According to some embodiments, the plurality of dies are dies having different functions to form a multi-chip module.

At least one embodiment in the present disclosure relates to a chip packaging method, comprising: forming a protective layer on a die active surface of a die; attaching (such as adhering) the die formed with the protective layer onto a carrier, the die active surface facing the carrier, and a die back surface of the die facing away from the carrier; forming a molding layer to encapsulate the die; removing (such as stripping off) the carrier to expose the protective layer.

According to some embodiments, the protective layer has a Young's modulus of any numerical range or value below: 1,000 MPa to 20,000 MPa, 1,000 MPa to 10,000 MPa, 4,000 MPa to 8,000 MPa and 5,500 MPa.

According to some embodiments, the forming the protective layer on the die active surface includes: forming the protective layer on a wafer active surface of a wafer, and cutting the wafer formed with the protective layer to form a plurality of dies having the protective layer.

According to some embodiments, the protective layer has a thickness of any numerical range or value below: 15 μm to 50 μm, 20 μm to 50 μm, 35 μm, 45 μm and 50 μm.

According to some embodiments, the protective layer has a coefficient of thermal expansion of any numerical range or value below: 3 ppm/K to 10 ppm/K, 5 ppm/K, 7 ppm/K and 10 ppm/K.

According to some embodiments, the molding layer has a coefficient of thermal expansion of any numerical range or value below: 3 ppm/K to 10 ppm/K, 5 ppm/K, 7 ppm/K and 10 ppm/K.

According to some embodiments, the protective layer comprises an organic/inorganic composite material.

According to some embodiments, the protective layer and the molding layer have a substantially same coefficient of thermal expansion.

According to some embodiments, the protective layer includes inorganic filler particles.

According to some embodiments, the inorganic filler particles have a diameter of less than 3 μm.

According to some embodiments, the inorganic filler particles have a diameter between 1 μm and 2 μm.

According to some embodiments, the chip packaging method, further comprises: forming a protective layer opening in the protective layer, wherein an area ratio of a lower surface of the protective layer opening to an upper surface of the protective layer opening is 60% to 90%.

According to some embodiments, the chip packaging method further comprises: filling a conductive material into the protective layer opening to form a filled via hole.

According to some embodiments, the chip packaging method further comprises: thinning the molding layer at a molding layer back surface of the molding layer to expose the die back surface.

According to some embodiments, the chip packaging method further comprises: forming a dielectric layer and a conductive layer, and forming a groove on a surface of the dielectric layer at a position corresponding to the conductive layer by etching metal.

According to some embodiments, the chip packaging method further comprises: performing plasma surface treatment and/or chemically-promoting modifier treatment on the wafer active surface of the wafer and/or a surface, facing the wafer, of the protective layer.

According to some embodiments, the chip packaging method further comprises: performing a chemical plating process on the wafer active surface to form a conductive cover layer on an electrical connection pad provided on the die active surface.

The specific embodiments as described above are intended to further explain the technical solutions and technical effects of the present disclosure in detail; but it should be understood by those skilled in the art that the foregoing embodiments merely are specific embodiments, and not intended to limit the present disclosure; any modification, equivalent substitution, improvement and the like, made within the inventive ideas of the present disclosure should be covered within the protection scope of the present disclosure.

What is claimed is:

1. A method for chip packaging of a plurality of dies, comprising:
   providing a protective layer comprising an organic/inorganic composite material layer with filler particles for the protective layer,
      wherein the protective layer comprises Young's Modules and a protective layer thickness for providing buffering and support for a conductive layer and for preventing burring and chipping from a singulation process to separate a wafer into the dies, and
      wherein the protective layer comprises a coefficient of thermal expansion for preventing interface stress and interface fatigue between the dies and the protective layer;
   forming the protective layer on a die active surface of a die; and
   forming a plurality of protective layer openings in the protective layer.

2. The method of claim 1, further comprising
   filing the protective layer openings with a conductive material for forming conductive filled vias in the protective layer, wherein the conductive filled vias are electrically coupled to the electrical components of the dies.

3. The method of claim 2, wherein forming a plurality of protective layer openings in the protective layer further comprises forming a smooth side wall for filling the conductive material sufficiently.

4. The method of claim 2, further comprising:
   forming a conductive layer at least partially on the conductive filled vias and the protective layer, wherein the conductive layer is electrically coupled to the conductive filled vias.

5. The method of claim 4, wherein forming the conductive layer further comprises:
   forming a trace at least partially on the conductive filled vias and the protective layer; and
   forming at least one stud on the trace, wherein the at least one stud is electrically coupled to the trace.

6. The method of claim 5, further comprising:
   forming a dielectric layer for encapsulating the conductive layer, wherein the at least one stud is exposed from the dielectric layer.

7. The method of claim 6, further comprising:
   forming a groove in the dielectric layer for exposing the at least one stud from the dielectric layer.

8. The method of claim 7, further comprising:
   forming a solder partially into the groove for electrically coupling the at least one stud to a circuit board or a substrate.

9. The method of claim 1, further comprising:
   configuring the protective layer with the Young's Modules ranging from 1,000 MPa to 20,000 MPa and with the protective layer thickness ranging from 15 μm to 50 μm.

10. The method of claim 1, further comprising:
    configuring the filler particles with a diameter of less than 3 μm.

11. The method of claim 1, further comprising:
    forming a plurality of protective layer openings in the protective layer, wherein an area ratio of a lower surface of each protective layer opening to an upper surface of the protective layer opening is configured in a range of 60% to 90%.

12. The method of claim 1, further comprising:
    attaching the dies with the protective layer onto a carrier, wherein the die active surface of each die faces to the carrier and a die back surface of each die faces away from the carrier;
    forming an encapsulation layer for encapsulating the dies; and
    removing the carrier for exposing the protective layer.

13. The method of claim 12, further comprising:
    configuring the protective layer with a coefficient of thermal expansion ranging from 3 ppm/K to 10 ppm/K; and
    configuring the encapsulation layer with a coefficient of thermal expansion ranging from 3 ppm/K to 10 ppm/K.

14. The method of claim 12, wherein the protective layer openings are formed either before or after attaching the die with the protective layer onto the carrier.

* * * * *